United States Patent
Hsing et al.

(10) Patent No.: US 8,598,637 B2
(45) Date of Patent: Dec. 3, 2013

(54) HIGH VOLTAGE JUNCTION FIELD EFFECT TRANSISTOR WITH SPIRAL FIELD PLATE

(75) Inventors: Michael R. Hsing, Saratoga, CA (US); Martin E. Garnett, Los Gatos, CA (US); Ognjen Milic, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 613 days.

(21) Appl. No.: 12/562,328

(22) Filed: Sep. 18, 2009

(65) Prior Publication Data
US 2011/0068377 A1    Mar. 24, 2011

(51) Int. Cl.
*H01L 29/66* (2006.01)

(52) U.S. Cl.
USPC .......................................... 257/272

(58) Field of Classification Search
USPC ........... 257/256–287, 536–564; 438/186–196
See application file for complete search history.

(56) References Cited

U.S. PATENT DOCUMENTS

| | | | |
|---|---|---|---|
| 5,376,816 A * | 12/1994 | Nishigoori et al. | 257/370 |
| 5,498,899 A * | 3/1996 | Palara | 257/536 |
| 6,150,699 A * | 11/2000 | Wakabayashi | 257/378 |
| 6,420,774 B1 * | 7/2002 | Lin et al. | 257/545 |
| 6,424,005 B1 * | 7/2002 | Tsai et al. | 257/335 |
| 6,680,515 B1 * | 1/2004 | Hsing | 257/409 |
| 2005/0269661 A1 * | 12/2005 | Singh | 257/492 |
| 2007/0158790 A1 * | 7/2007 | Rao | 257/655 |

OTHER PUBLICATIONS

The Art of Analog Layout, Second Edition; published Jul. 4, 2005; pp. 82-83.

* cited by examiner

*Primary Examiner* — Fernando L Toledo
*Assistant Examiner* — Karen Kusumakar
(74) *Attorney, Agent, or Firm* — Perkins Coie LLP

(57) ABSTRACT

In one embodiment, a junction field effect transistor having a substrate, wherein formed on the substrate is a graded n-doped region having a high doping concentration in an inner region and a low doping concentration in an outer region, with a p-doped buried region adjacent to the graded n-doped region near the outer region, and a spiral resistor connected to the graded n-doped region at its inner region and at its outer region. An ohmic contact at the inner region provides the drain, an ohmic contact at the outer region provides the source, and an ohmic contact at the substrate provides the gate.

19 Claims, 4 Drawing Sheets

US 8,598,637 B2

HIGH VOLTAGE JUNCTION FIELD EFFECT TRANSISTOR WITH SPIRAL FIELD PLATE

FIELD

The present invention relates to semiconductor electronics.

BACKGROUND

Many DC-to-DC power converters may be conceptualized by the circuit illustrated in FIG. 1A, where electrical power from a source having a supply voltage $V_{IN}$ is provided to load 102 such that the load voltage is regulated to some voltage less than $V_{IN}$. A feedback path is provided from node 103 to controller 104, where controller 104 controls the duty cycle of high-side switch 106 and low-side switch 108 to regulate the load voltage. A second-order low pass filter comprising inductor 110 and capacitor 112 couples load 102 to switch point 114 so as to smooth output ripples. In practice, the circuit components in FIG. 1, except for inductor 110, capacitor 112, and load 102, are integrated on a single silicon die. The operating principles for the circuit of FIG. 1 are well known to those skilled in the art of power converters, and need not be repeated here.

For some consumer applications, the supply voltage $V_{IN}$ may peak to several hundred volts, in which case the voltage drop across switch 106 or 108 may also peak to several hundred volts. Accordingly, for such applications, switches 106 and 108 should be designed to operate under such high voltage drops.

Some circuit components within controller 104 may need to derive their power from the supply voltage $V_{IN}$, but are designed to operate only over voltage drops on the order of ten volts. A JFET (Junction Field Effect Transistor) may serve as a voltage source for such low voltage components, where the JFET is powered by the supply voltage $V_{IN}$. A generic application is illustrated in FIG. 1B, where the drain of JFET 116 is at the supply voltage $V_{IN}$, and its source is connected to load 118. The source voltage developed at node 120 (the source terminal or port) is denote as $V_S$. With gate 122 grounded, the source voltage developed at node 120 is such that the load current through load 118 matches the drain-source current through JFET 116. Stated more formally, if the drain-source current $I_{DS}$ of JFET 116 is given by $I_{DS}=f(V_{GS}, V_{DS})$ where $V_{GS}$ is the gate-to-source voltage and $V_{DS}$ is the drain-to-source voltage of JFET 116, and if the load current $I_L$ through load 118 satisfies $I_L=Y(V_S)$, then the source voltage $V_S$ is such that $Y(V_S)=f(-V_S, V_{IN}-V_S)$.

A JFET that can withstand a drain-source voltage drop of several hundred volts, but prevent its source terminal from exceeding a voltage in the range of tens of volts above ground potential, has utility in DC-to-DC power converters, as well as in other applications.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Although embodiments find application to DC-to-DC power converters, embodiments are not limited to such applications.

Figure 1A:
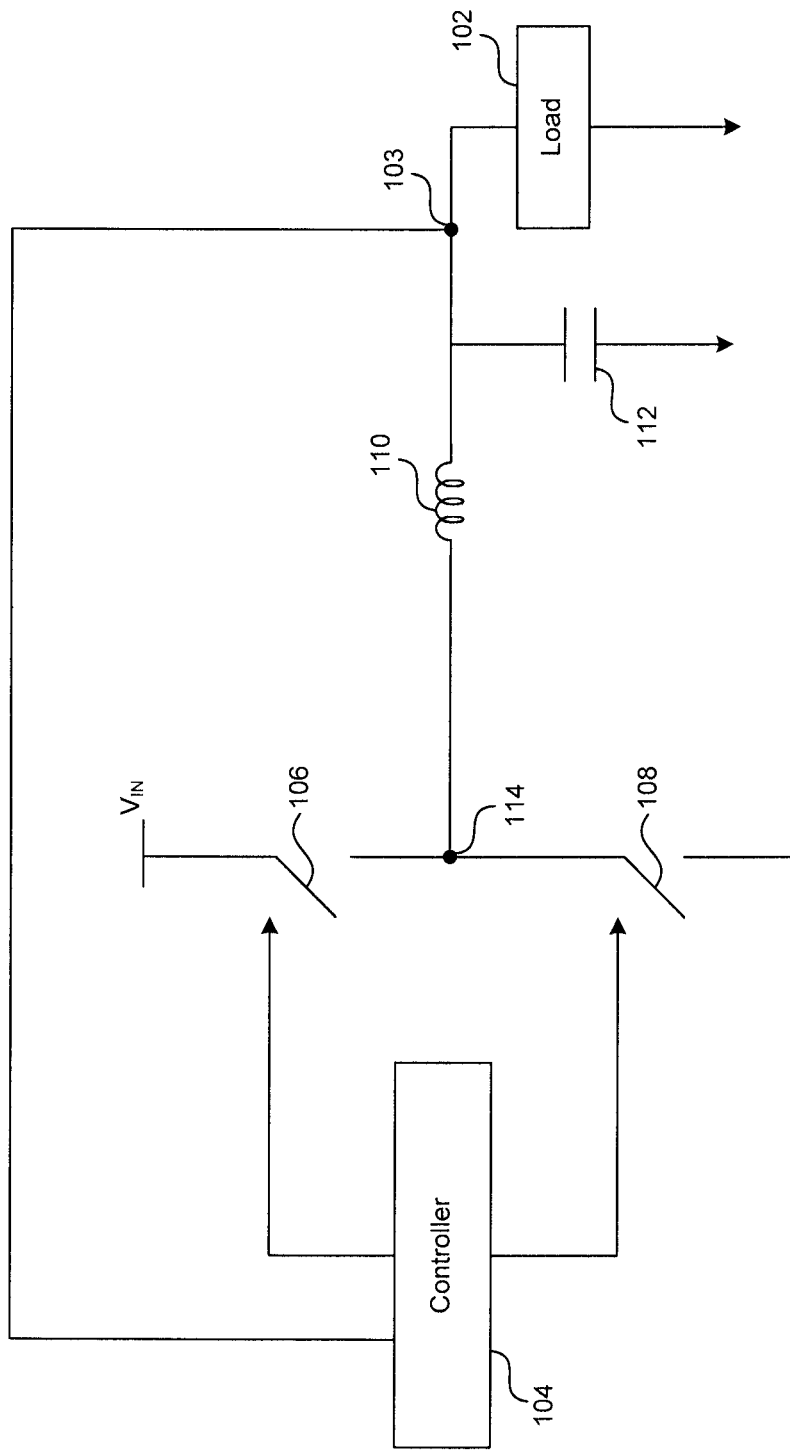
FIGS. 1A and 1B illustrate a prior art DC-to-DC power converter and a generic application of a JFET, respectively.
Figure 1B:
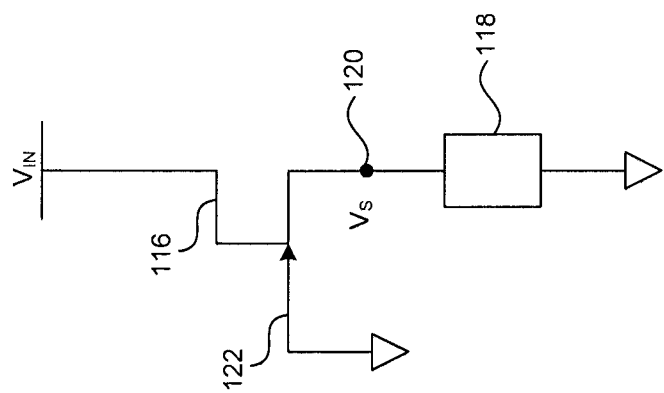
Figure 2:
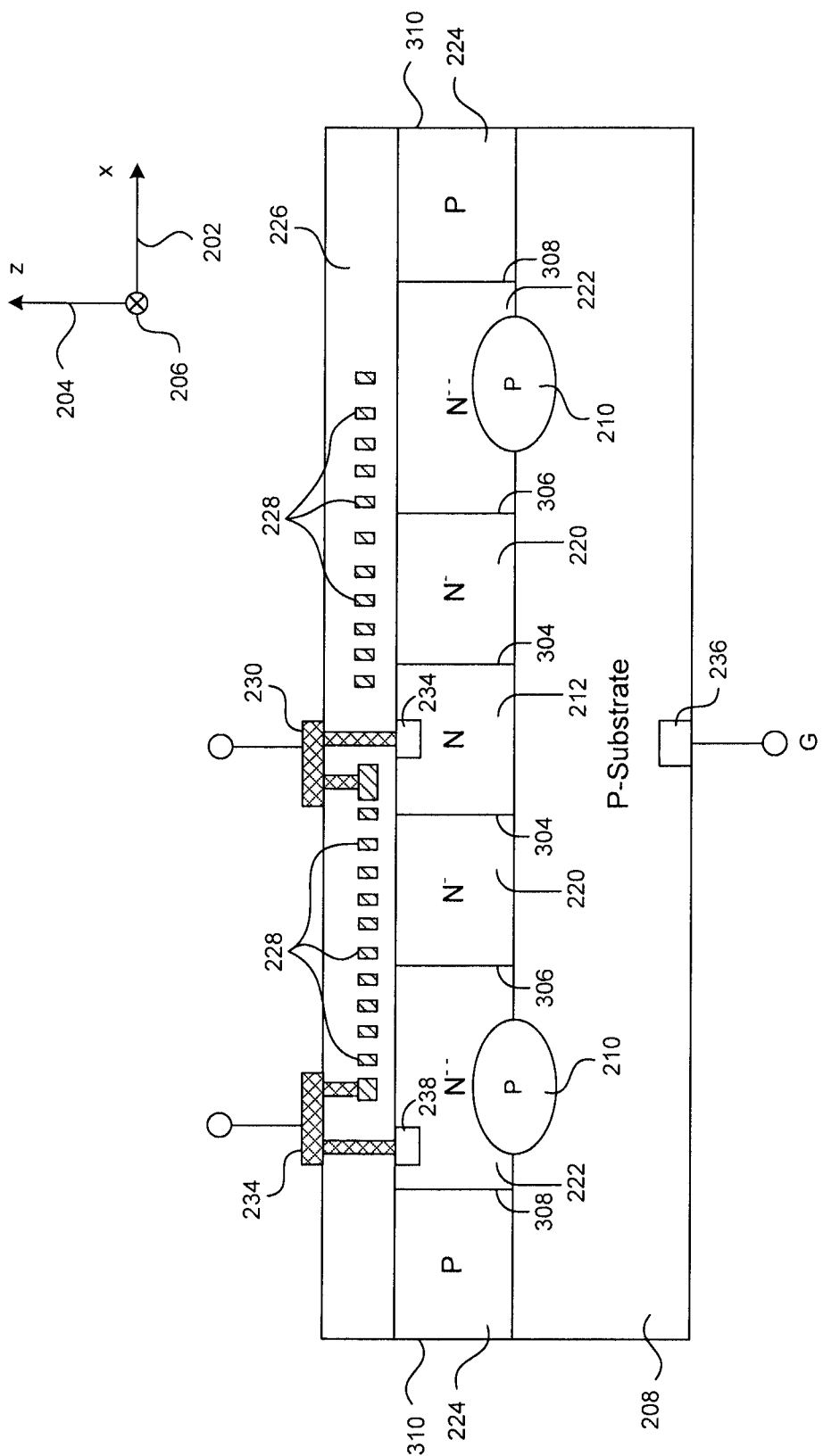
FIG. 2 illustrates a cross-sectional plan view of an embodiment.

FIG. 2 illustrates a cross-sectional plan view of a portion of a silicon die according to an embodiment. For ease of illustration, FIG. 2 is not drawn to scale, and various doped regions are idealized as rectangles. For reference, shown in FIG. 2 is a coordinate system with x-axis 202 and z-axis 204 lying in the plane of illustration, with y-axis 206 pointing into the plane of the illustration. With the coordinate system as shown, the cross-sectional view illustrated in FIG. 2 is taken as a slice of an embodiment, with the slice perpendicular to y-axis 206.

Figure 3:
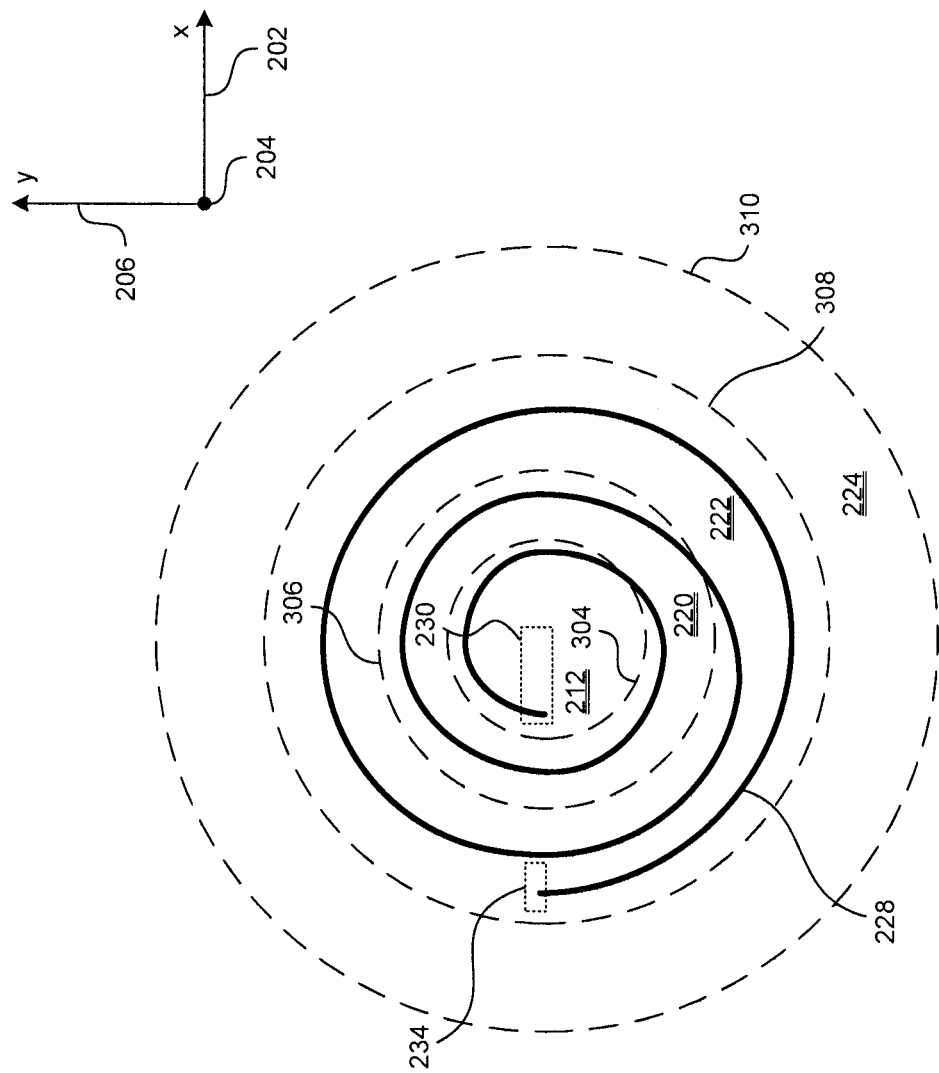
FIG. 3 illustrates a top plan view of an embodiment.

FIG. 3 illustrates a cross-sectional plan view of a portion of the silicon die according to an embodiment, but with a different view than that of FIG. 2. To provide relative orientations of the embodiment of FIG. 2 and the embodiment of FIG. 3, the coordinate system in FIG. 2 is also shown in FIG. 3, making clear that the cross-sectional view illustrated in FIG. 3 is a slice of an embodiment, with the slice taken perpendicular to z-axis 204. For ease of illustration, FIG. 3 is not drawn to scale.

Referring to FIG. 2, formed in p-doped substrate 208 is p-doped buried layer 210. Regions 212, 220, and 222 are n-doped regions, where regions 220 and 222 appear noncontiguous only because of the way the slice is taken to provide the view of the illustration, but for the embodiments of FIGS. 2 and 3, regions 220 and 222 are contiguous and surrounds n-doped region 212. This is made clear by the view illustrated in FIG. 3, where dashed circles 304 and 306 in FIG. 3 correspond, respectively, to junctions 304 and 306 in FIG. 2, where junction 304 is the junction between n-doped regions 212 and 220, and junction 306 is the junction between n-doped regions 220 and 222.

Adjacent to n-doped region 212 is n-doped region 220 surrounding n-doped region 212, represented by the annulus between dashed circles 304 and 306 in FIG. 3. N-doped region 220 is doped less than n-doped region 212, as indicated by the symbol N⁻ in FIG. 2. Adjacent to n-doped region 220 is n-doped region 222 surrounding n-doped region 220, represented by the annulus between dashed circles 306 and 308 in FIG. 3. N-doped region 222 is doped less than n-doped region 220, as indicated by the symbol N⁻ in FIG. 2. N-doped region 222 is formed over p-buried layer 210 so that there is an n-p junction formed by their interface. Adjacent to n-doped region 222 is p-doped region 224, represented by the annulus between dashed circles 308 and 310 in FIG. 3. P-doped region 224 may be part of p-substrate 208, but for ease of discussion is labeled as a distinct region. Regions 212, 220, 222, and 224 may not be exactly circular in shape, and for some embodiments, may take on other geometric shapes, or they may be irregular.

Referring to FIG. 2, label 226 denotes a dielectric layer, such as for example SiO₂. Formed in oxide layer 226 is spiral resistor 228. Spiral resistor 228 may also be referred to as a spiral field plate. In FIG. 2, the cross-sectional view of spiral resistor 228 is indicated by the hatched rectangles. Solid spiral line 228 in FIG. 3 represents spiral resistor 228, however, a simplification is made because the number of turns of spiral resistor 228 as shown in FIG. 3 is less than the number of turns represented in FIG. 2. Also, for simplicity all turns in FIG. 3 are shown equal in thickness (in the x-y plane), whereas this is not so for FIG. 2. Furthermore, for clarity of illustration, the scale of the various regions in FIG. 3 does not match that of FIG. 2. The slice in FIG. 3 is taken along spiral resistor 228 in the x-y plane, hence other structures in FIG. 3 are shown dashed because they are present below or above (along the z-axis dimension) the slice.

The inner end of spiral resistor 228 is electrically connected to n-doped region 212. For example, in embodiments represented by the illustrations in FIGS. 2 and 3, the inner most end of spiral resistor 228 is connected to n-doped region 212 by way of highly doped n-region 234, and by a set of vias and an interconnect, collectively labeled by the numeral 230, and shown cross-hatched in the illustration of FIG. 2 and as a dashed rectangle in FIG. 3. Region 234 is a highly doped n-region to provide a good electrical contact between spiral resistor 228 and region 212, so that highly doped n-region 234 and set of vias and interconnect 230 serve as an ohmic contact.

The outer end of spiral resistor 228 is electrically connected to n-doped region 222. For example, in embodiments represented by the illustrations in FIGS. 2 and 3, the outer most end of spiral resistor 228 is connected to n-doped region 222 by way of highly doped n-region 238, and by a set of vias and an interconnect, collectively labeled by the numeral 234, and shown cross-hatched in the illustration of FIG. 2 and as a dashed rectangle in FIG. 3. Region 238 is highly doped to provide a good electrical contact between spiral resistor 228 and region 222, so that highly doped n-region 238 and set of vias and interconnect 234 serve as an ohmic contact.

Spiral resistor 228 may not be exactly a spiral, and for some embodiments spiral resistor 228 may not have a spiral shape, but instead may meander from above region 212 to above region 222. Some embodiments may have spiral resistor 228 comprising straight sections, so as to enclose a region somewhat rectangular in nature, but with curved corners. Accordingly, in general, the descriptive term "spiral resistor" is not meant to imply that the resistor coupling the outer n-doped region (e.g., 222) to the inner n-doped region (e.g., 212) is necessarily spiral in shape.

For some embodiments, spiral resistor 228 may comprise polysilicon. Well known design techniques may be used so that spiral resistor 228 has some desired resistance. For example, for some embodiments the sheet resistance of the polysilicon used for spiral resistor 228 may be from 1KΩ/square to 5KΩ/square, and a typical resistance for spiral resistor 228 may be in the neighborhood of 60MΩ. For some embodiments, the typical radii of curvature for the bends in spiral resistor 228 may be in the neighborhood of 100 μm to 200 μm. These numerical values are given merely to provide examples. Other embodiments may have numerical values not represented by these numerical ranges or values.

Regions 212, 220, and 222 provide a graded doping profile. For simplicity, only three such graduations or steps in doping are shown, but other embodiments may have a different number of such graduations or steps in doping level. As an example of doping levels, region 212 may have a doping level in the range of $10^{15}$ cm$^{-3}$ to $10^{16}$ cm$^{-3}$, where the doping profile is such that region 220 is doped at 1/10 the level of region 212, and region 222 is doped at 1/10 the level of region 220. These numerical values are given merely to provide examples. Other embodiments may have numerical values not represented by these numerical ranges or values.

The integrated device illustrated in FIG. 2 comprises an nJFET, where interconnect 230 serves as the drain (labeled "D"), interconnect 234 serves as the source (labeled "S"), and p-substrate 208 serves as the gate (labeled "G"), where highly doped p-region 236 provides an ohmic contact for the gate. In practice, the drain may be at some relatively high voltage, such as the supply voltage $V_{IN}$, and the gate may be grounded, where it is desired that the source voltage not rise too high, such as for example in the range of a few tens of volts.

The drain-source voltage difference appears across spiral resistor 228, but if the resistance of spiral resistor 228 is sufficiently high, the resulting current may be set to a relatively low value to reduce wasted power and heat. Spiral resistor 228 sets the voltage potential at the surfaces of regions 212, 220, and 222, so as to mitigate high electric fields that may cause breakdown. The graded doping profile provided by regions 212, 220, and 222 profiles the depletion region between p-substrate 208 and n-doped regions 212, 220, 222 so that the depletion region has less depth towards p-doped region 224, thereby mitigating punch-through.

Various modifications may be made to the described embodiments without departing from the scope of the invention as claimed below.

It is to be understood in these letters patent that the meaning of "A is connected to B", where for example A or B may be, but are not limited to, a node, a device terminal, or a port, is that A and B are electrically connected to each other by a conductive structure so that for frequencies within the signal bandwidth of interest, the resistance, capacitance, and inductance introduced by the conductive structure may each be neglected. For example, a transmission line (e.g., microstrip), relatively short compared to the signal wavelength of interest, may be designed to introduce a relatively small impedance, so that two devices in electrical contact at each end of the transmission line may be considered to be connected to one another.

It is also to be understood in these letters patent that the meaning of "A is coupled to B" is that either A and B are connected to each other as described above, or that, although A and B may not be connected to each other as described above, there is nevertheless a device or circuit that is connected to both A and B so that a properly defined voltage or current at one of the two elements A or B has some effect on a properly defined voltage or current at the other of the two elements.

What is claimed is:

1. A junction field effect transistor comprising:
   a substrate;
   a p-doped buried layer adjacent to the substrate;
   an n-doped region adjacent to the p-doped buried layer and the substrate, the n-doped region comprising a first n-doped region having a first doping concentration, and a last n-doped region adjacent to the p-doped buried layer and having a last doping concentration less than the first doping concentration; and
   a resistor electrically coupled to the first n-doped region and to the last n-doped region.

2. The junction field effect transistor as set forth in claim 1, having a drain, a source, and a gate, further comprising:
   a drain ohmic contact coupled to the first n-doped region to provide the drain;
   a source ohmic contact coupled to the last n-doped region to provide the source; and
   a gate ohmic contact coupled to the substrate to provide the gate.

3. The junction field effect transistor as set forth in claim 1, further comprising a p-doped region adjacent to the last n-doped region and to the substrate.

4. The junction field effect transistor as set forth in claim 3, wherein the p-doped region is part of the substrate.

5. The junction field effect transistor as set forth in claim 1, further comprising:
   a dielectric layer formed on the n-doped region, wherein the resistor is formed in the dielectric layer;

a first ohmic contact to electrically couple the resistor to the first n-doped region; and a second ohmic contact to electrically couple the resistor to the last n-doped region.

6. The junction field effect transistor as set forth in claim 5, wherein the first ohmic contact comprises a first highly doped n-region in the first n-doped region, a first via in the dielectric layer connected to the first highly doped n-region, an interconnect connected to the first via, and a second via in the dielectric layer connected to the interconnect and to the resistor; and the second ohmic contact comprises a second highly doped n-region in the last n-doped region, a first via in the dielectric layer connected to the second highly doped n-region, an interconnect connected to the first via of the second ohmic contact, and a second via in the dielectric layer connected to the interconnect of the second ohmic contact and to the resistor.

7. The junction field effect transistor as set forth in claim 1, the n-doped region comprising a second n-doped region adjacent to the first n-doped region and the substrate, and having a second doping concentration less than the first doping concentration and greater than the last doping concentration.

8. The junction field effect transistor as set forth in claim 1, wherein a portion of the resistor surrounds the first n-doped region.

9. The junction field effect transistor as set forth in claim 8, wherein the resistor surrounds the first n-doped region.

10. The junction field effect transistor as set forth in claim wherein the resistor has a spiral shape.

11. The junction field effect transistor as set forth in claim 1, wherein the last n-doped region surrounds the first n-doped region.

12. A junction field effect transistor comprising:
    a substrate;
    a graded n-doped region having an inner portion and an outer portion, with a graded doping concentration high at the inner region and low at the outer region;
    a p-doped buried layer formed in the substrate and adjacent to the outer region of the graded n-doped region; and
    a resistor electrically coupled to the graded n-doped region at the inner region and at the outer region.

13. The junction field effect transistor as set forth in claim 12, wherein a portion of the resistor surrounds the inner region.

14. The junction field effect transistor as set forth in claim 13, wherein the resistor surrounds the inner region.

15. The junction field effect transistor as set forth in claim 12, wherein the graded n-doped region has a stepped doping profile.

16. The junction field effect transistor as set forth in claim 12, the junction field effect transistor having a drain, a source, and a gate, further comprising:
    a drain ohmic contact coupled to the inner region to provide the drain;
    a source ohmic contact coupled to the outer region to provide the source; and
    a gate ohmic contact coupled to the substrate to provide the gate.

17. The junction field effect transistor as set forth in claim 12, further comprising:
    a dielectric layer, wherein the resistor is formed in the dielectric layer;
    a first ohmic contact to electrically couple the resistor to the inner region; and
    a second ohmic contact to electrically couple the resistor to the outer region.

18. The junction field effect transistor as set forth in claim 17, wherein the first ohmic contact comprises a first highly doped n-region in the inner region, a first via in the dielectric layer connected to the first highly doped n-region, an interconnect connected to the first via, and a second via in the dielectric layer connected to the interconnect and to the resistor; and the second ohmic contact comprises a second highly doped n-region in the outer region, a first via in the dielectric layer connected to the second highly doped n-region, an interconnect connected to the first via of the second ohmic contact, and a second via in the dielectric layer connected to the interconnect of the second ohmic contact and to the resistor.

19. The junction field effect transistor as set forth in claim 12, wherein the resistor has a spiral shape.

* * * * *